US010405449B2

(12) United States Patent
Nakagawa

(10) Patent No.: US 10,405,449 B2
(45) Date of Patent: Sep. 3, 2019

(54) ELECTRONIC APPARATUS

(71) Applicant: Sony Interactive Entertainment Inc., Tokyo (JP)

(72) Inventor: Kazuto Nakagawa, Kanagawa (JP)

(73) Assignee: Sony Interactive Entertainment Inc., Tokyo (JP)

(*) Notice: Subject to any disclaimer, the term of this patent is extended or adjusted under 35 U.S.C. 154(b) by 0 days.

(21) Appl. No.: 16/086,455

(22) PCT Filed: Mar. 17, 2017

(86) PCT No.: PCT/JP2017/010926
§ 371 (c)(1),
(2) Date: Sep. 19, 2018

(87) PCT Pub. No.: WO2017/169902
PCT Pub. Date: Oct. 5, 2017

(65) Prior Publication Data
US 2019/0104631 A1 Apr. 4, 2019

(30) Foreign Application Priority Data

Mar. 31, 2016 (JP) ................. 2016-073351

(51) Int. Cl.
*G06F 1/16* (2006.01)
*H05K 5/02* (2006.01)
(Continued)

(52) U.S. Cl.
CPC ......... *H05K 7/1422* (2013.01); *G06F 1/1656* (2013.01); *G11B 33/12* (2013.01);
(Continued)

(58) Field of Classification Search
CPC .......... H05K 7/14; H05K 7/1422; H05K 5/00; H05K 5/0004; H05K 5/02; H05K 5/0217; G11B 33/12; G06F 1/1656
See application file for complete search history.

(56) References Cited

U.S. PATENT DOCUMENTS

| | | | | |
|---|---|---|---|---|
| 5,675,300 A | * | 10/1997 | Romerein | H01R 13/6658 333/100 |
| 6,111,760 A | * | 8/2000 | Nixon | H05K 5/0013 220/4.02 |
| 6,909,047 B2 | * | 6/2005 | Zhang | G11B 33/124 174/50 |
| 7,209,195 B2 | * | 4/2007 | Lin | G02F 1/133308 349/58 |
| 9,408,315 B2 | | 8/2016 | Tsuchida | |

(Continued)

FOREIGN PATENT DOCUMENTS

| | | |
|---|---|---|
| JP | 2006217189 A | 8/2006 |
| JP | 2014239166 A | 12/2014 |
| WO | 2014185311 A1 | 11/2014 |

OTHER PUBLICATIONS

International Search Report for corresponding PCT Application No. PCT/JP2017/010926, 2 pages, dated May 30, 2017.
(Continued)

*Primary Examiner* — Adrian S Wilson
(74) *Attorney, Agent, or Firm* — Matthew B. Dernier, Esq.

(57) ABSTRACT

The present invention increases the degree of freedom in layout of parts possessed by an electronic apparatus. A lower cover (50) has a first engaging section (53A). An inner part (B) has a first edge section (S1) which is located under the first engaging section (53A) and which overlaps with the first engaging section (53A) in the vertical direction. The inner part (B) has a guide section (31) located below the first edge section (S1). The guide section (31) is formed such that
(Continued)

when the lower cover (50) and the inner part (B) are combined together in the vertical direction, the guide section (31) comes into contact with a right wall section (52B) of the lower cover (50) and pushes the right wall section (52B) rightward so as to cause the first engaging section (53A) to move rightward beyond the first edge section (S1).

10 Claims, 13 Drawing Sheets

(51) Int. Cl.
  *H05K 7/14* (2006.01)
  *G11B 33/12* (2006.01)
  *H05K 5/00* (2006.01)
  *H05K 7/20* (2006.01)
(52) U.S. Cl.
  CPC .............. *H05K 5/00* (2013.01); *H05K 5/0004* (2013.01); *H05K 5/02* (2013.01); *H05K 5/0217* (2013.01); *H05K 7/14* (2013.01); *H05K 7/20136* (2013.01)

(56) References Cited

U.S. PATENT DOCUMENTS

| | | | |
|---|---|---|---|
| 2009/0175020 A1* | 7/2009 | Zadesky | ............... G06F 1/1626 |
| | | | 361/818 |
| 2014/0362500 A1 | 12/2014 | Tsuchida | |
| 2015/0092337 A1* | 4/2015 | Tan | ...................... H05K 5/0008 |
| | | | 361/679.31 |
| 2016/0088760 A1 | 3/2016 | Yukito | |

OTHER PUBLICATIONS

International Preliminary Report on Patentability and Written Opinion for corresponding PCT Application No. PCT/JP2017/010926, 6 pages, dated Oct. 11, 2018.

\* cited by examiner

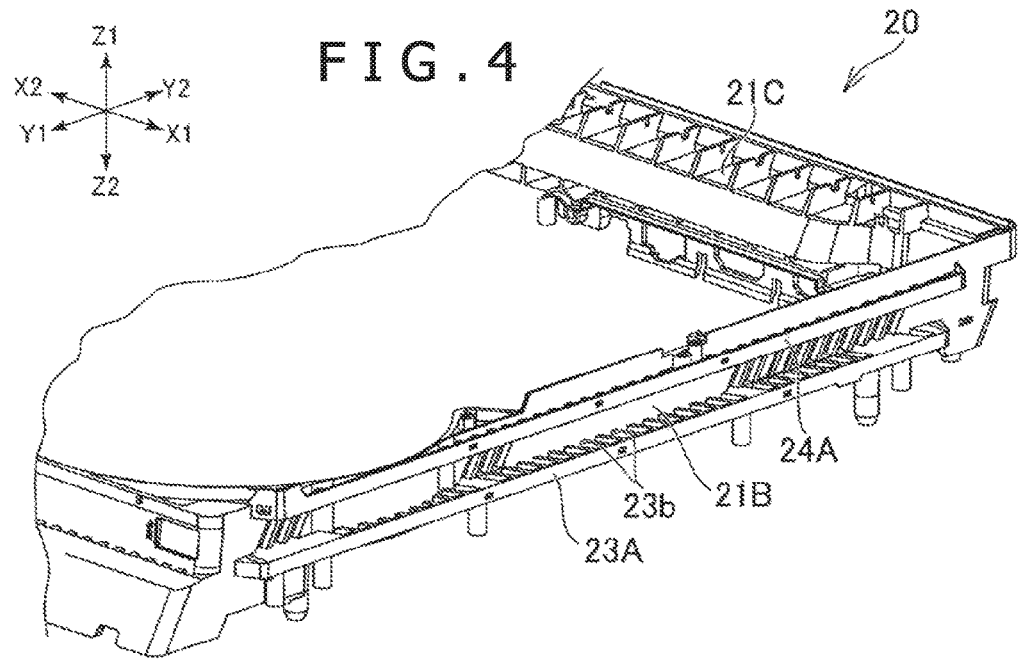
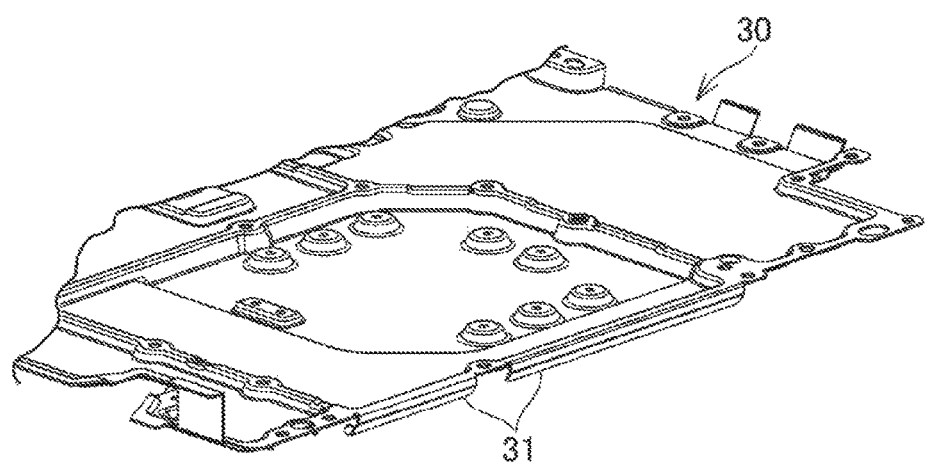
FIG.4

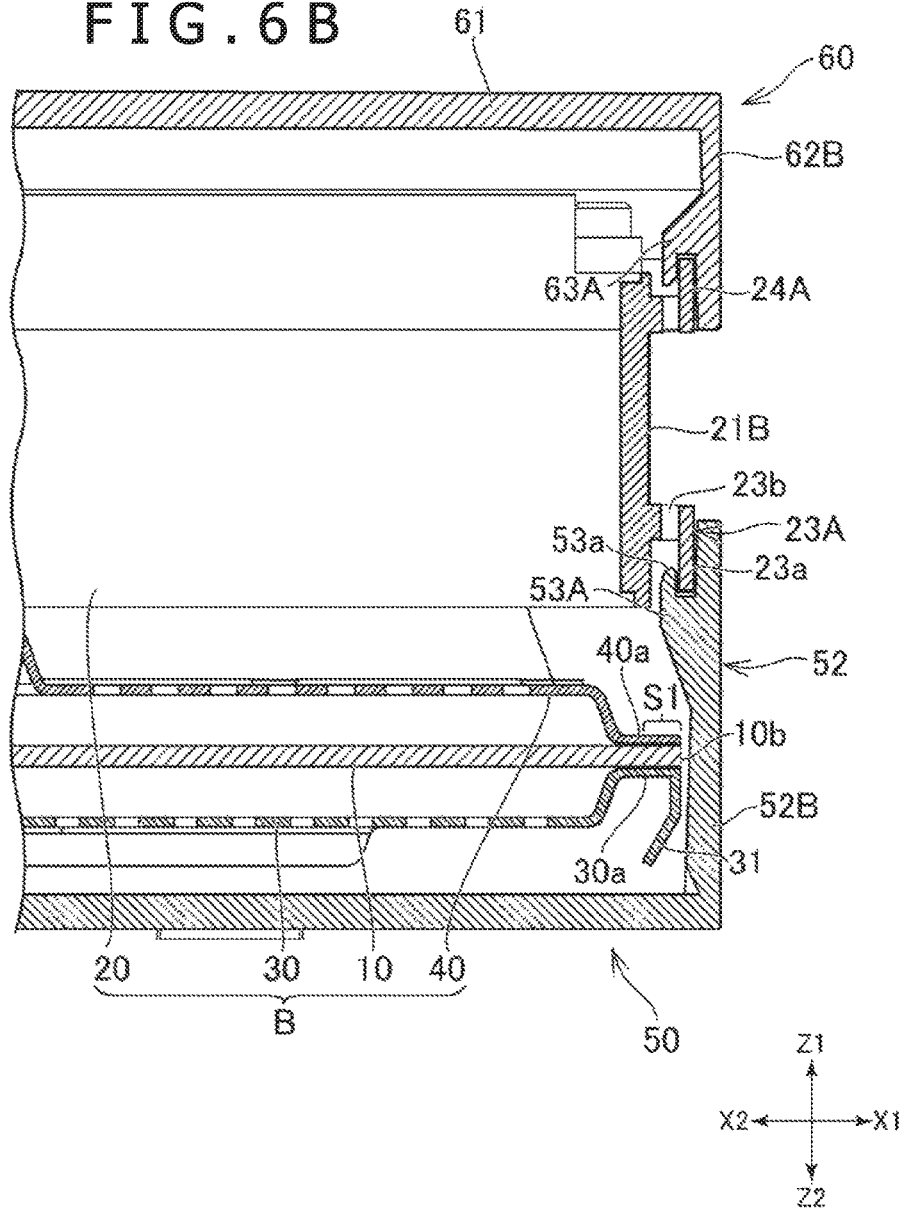

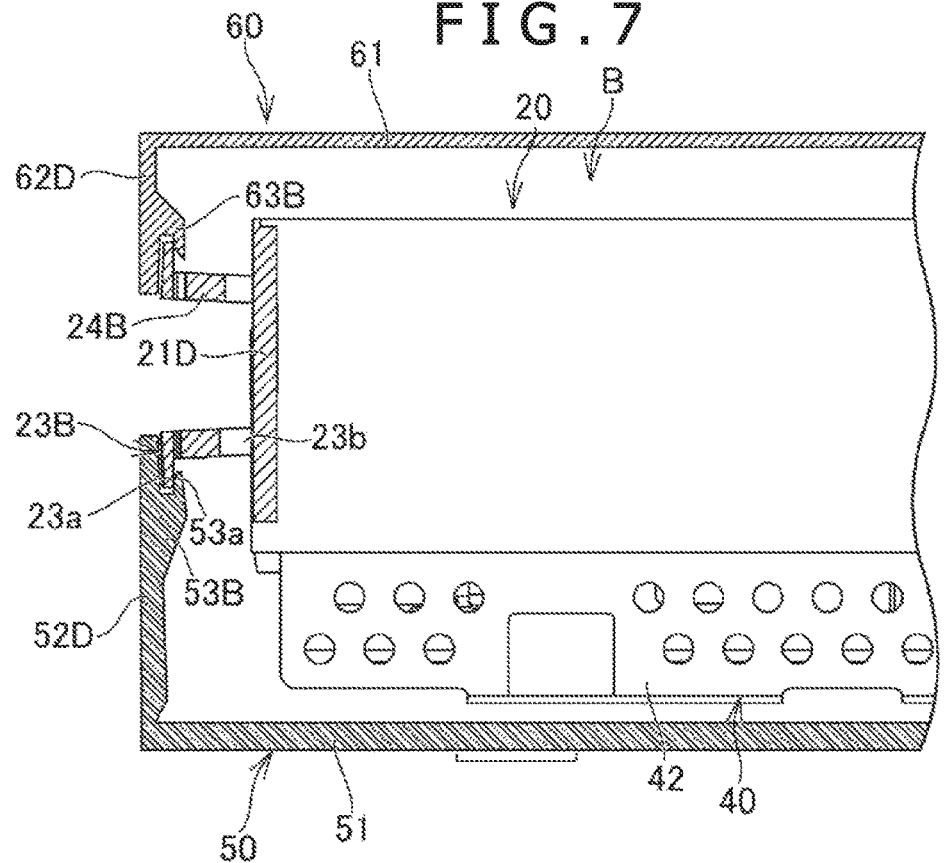

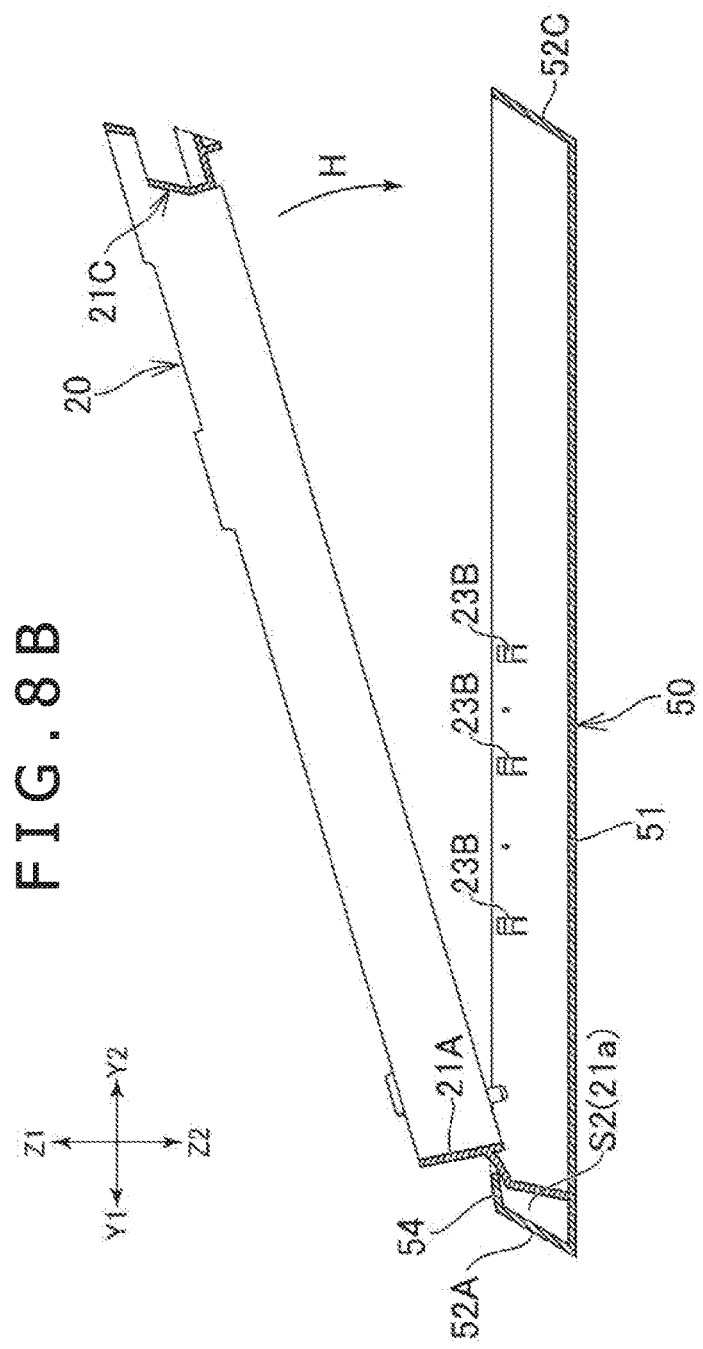

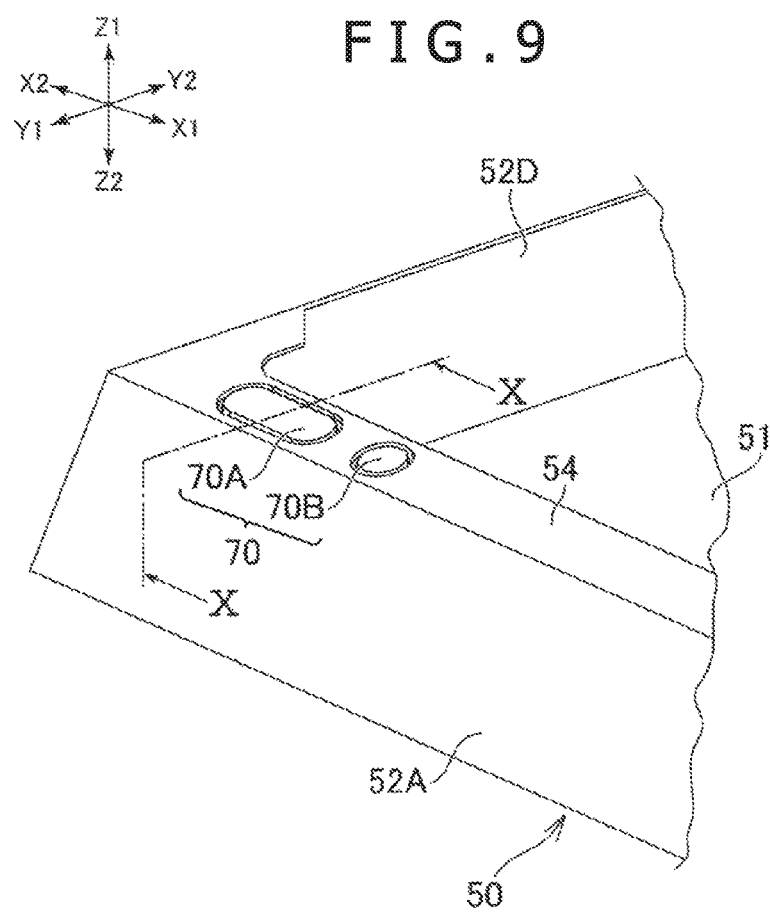

ELECTRONIC APPARATUS

TECHNICAL FIELD

The present invention relates to a vent hole of an electronic apparatus.

BACKGROUND ART

An electronic apparatus of PTL 1 set forth below includes a frame, an upper cover that covers the upper side of the frame, and a lower cover that covers the lower side of the frame. The frame has an outer peripheral section that surrounds various parts such as a cooling fan, a power supply unit, and an optical disk drive. These parts are mounted to the frame.

The upper cover has a peripheral wall section that surrounds the outer peripheral section of the frame. The upper cover is formed at an inner surface of the peripheral wall section thereof with engaging section projecting to the inner side, and the frame is formed with engaged sections at an outer surface of the outer peripheral section thereof. The engaging sections of the upper cover are caught on the engaged sections of the frame. By this, the peripheral wall section of the upper cover is restrained from being separated from the frame when a force of pulling the peripheral wall section of the upper cover to the outer side (a force for separating the peripheral wall section of the upper cover from the outer peripheral section of the frame) is exerted. The lower cover also has a peripheral wall section that surrounds the outer peripheral section of the frame. The lower cover also is formed with the similar structure as that of the upper cover. Specifically, the lower cover is formed at an inner surface of the peripheral wall section thereof with engaging sections projecting to the inner side. The engaging sections of the lower cover are caught on engaged sections formed in the frame.

CITATION LIST

Patent Literature

[PTL 1] PCT Patent Publication No. WO2014/185311

SUMMARY

Technical Problem

In the structure of the electronic apparatus disclosed in PTL 1, if a portion of the parts mounted to the frame is protruding to the outside of an outer peripheral edge of the frame (in other words, if a portion of the parts mounted to the frame is located immediately over or beneath the engaging section of the cover), the engaging section of the cover would come into contact with the protruding parts, in a process of combining the frame and the cover together in the vertical direction, so that it would be impossible to smoothly perform the assembling work. Therefore, the parts mounted to the frame should be laid out in such a manner as not to have any portion protruding to the outside from the outer peripheral edge of the frame.

Solution to Problem

An electronic apparatus for solving the above-mentioned problem includes an inner part, and an armor member disposed on one side in a first direction in relation to the inner part and covering the inner part. The inner part includes a first edge section and a guide section located on the one side in the first direction in relation to the first edge section. The armor member includes a peripheral wall section which includes in part thereof a first wall section located in a second direction intersecting the first direction in relation to the inner part and which surrounds an outer periphery of the inner part, and a first engaging section which is formed in the first wall section and which projects toward an inner side of the peripheral wall section. The first engaging section of the armor member is located on the other side in the first direction in relation to the first edge section of the inner part, in a state in which the inner part and the armor member are combined together in the first direction, and is disposed at such a position as to overlap with the first edge section of the inner part when the armor member and the inner part are viewed in the first direction, and is engaged with a first engaged section located on the inner side of the peripheral wall section. The guide section of the inner part is formed in such a manner that in a process in which the inner part and the armor member are combined together in the first direction, the guide section comes into contact with the first wall section located on the one side in the first direction in relation to the guide section to push the first wall section in the second direction, so as to cause the first engaging section to go over the first edge section of the inner part to reach the other side in the first direction.

According to this electronic apparatus, it is possible to increase the degree of freedom in layout of parts.

BRIEF DESCRIPTION OF DRAWINGS

FIG. 4 depicts perspective views depicting essential portions of the frame and a lower chassis, possessed by the electronic apparatus.

FIG. 6B is a sectional view depicting a state in which the parts depicted in FIG. 6A are combined together.

FIG. 7 is a sectional view of the electronic apparatus in a disassembled state, taken along line VII-VIIB of FIG. 1.

FIG. 8B is a sectional view depicting the posture of the frame in a process of uniting the frame and the lower cover, possessed by the electronic apparatus.

FIG. 9 is a perspective view of a portion where a button member is disposed.

DESCRIPTION OF EMBODIMENTS

Figure 1:
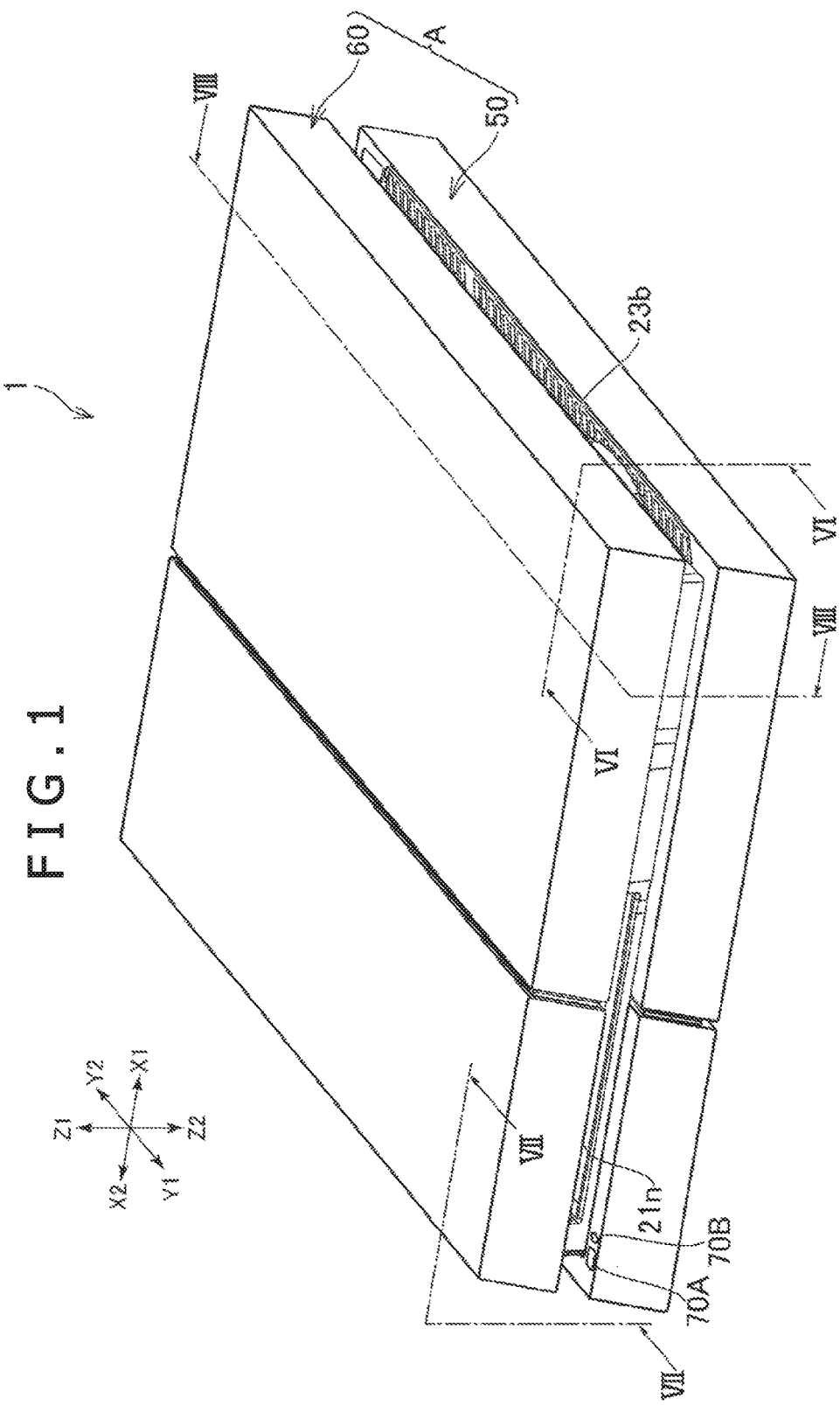
FIG. 1 is a perspective view of an electronic apparatus according to an embodiment of the present invention.
Figure 2:
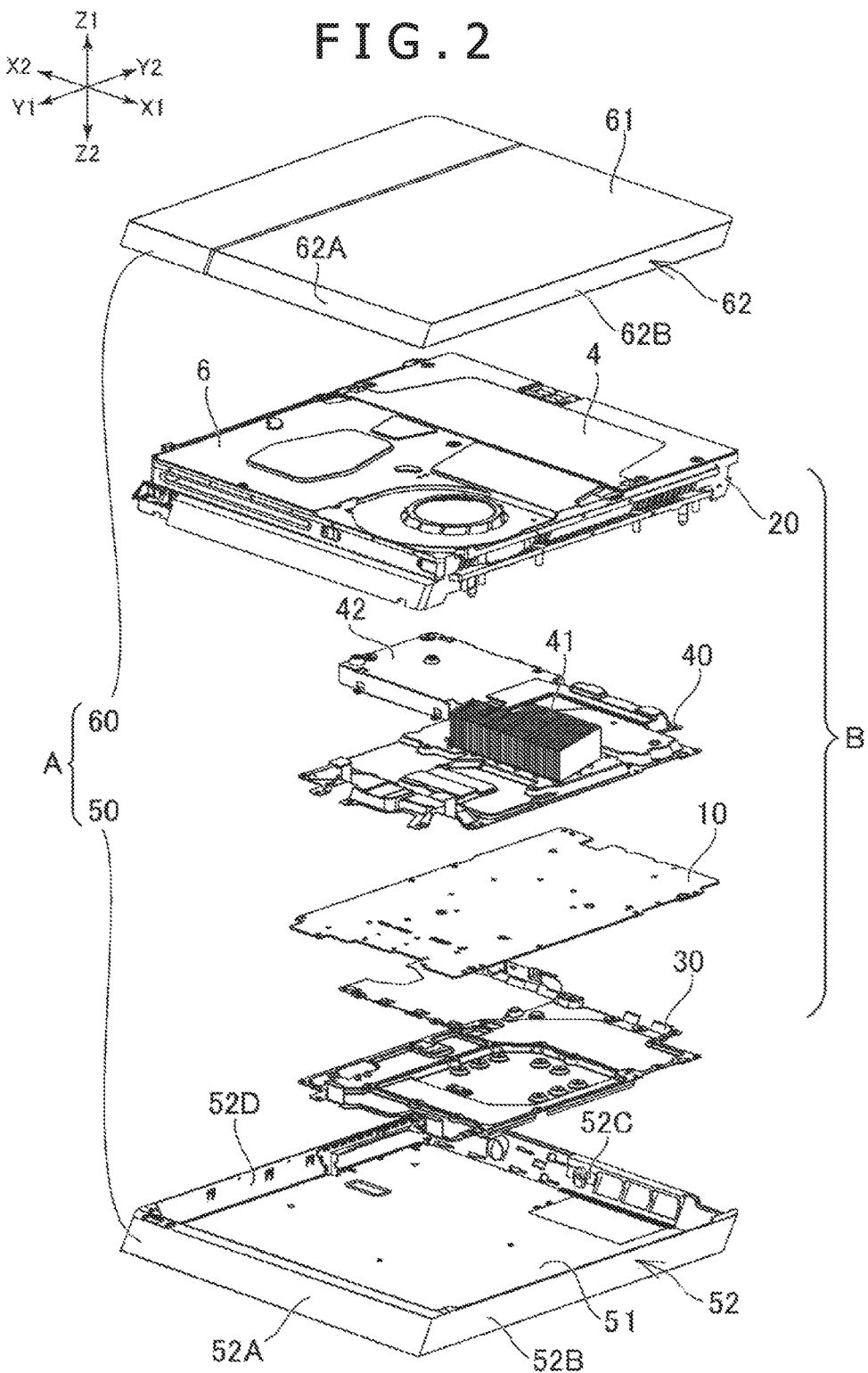
FIG. 2 is an exploded perspective view of the electronic apparatus depicted in FIG. 1.
Figure 3:
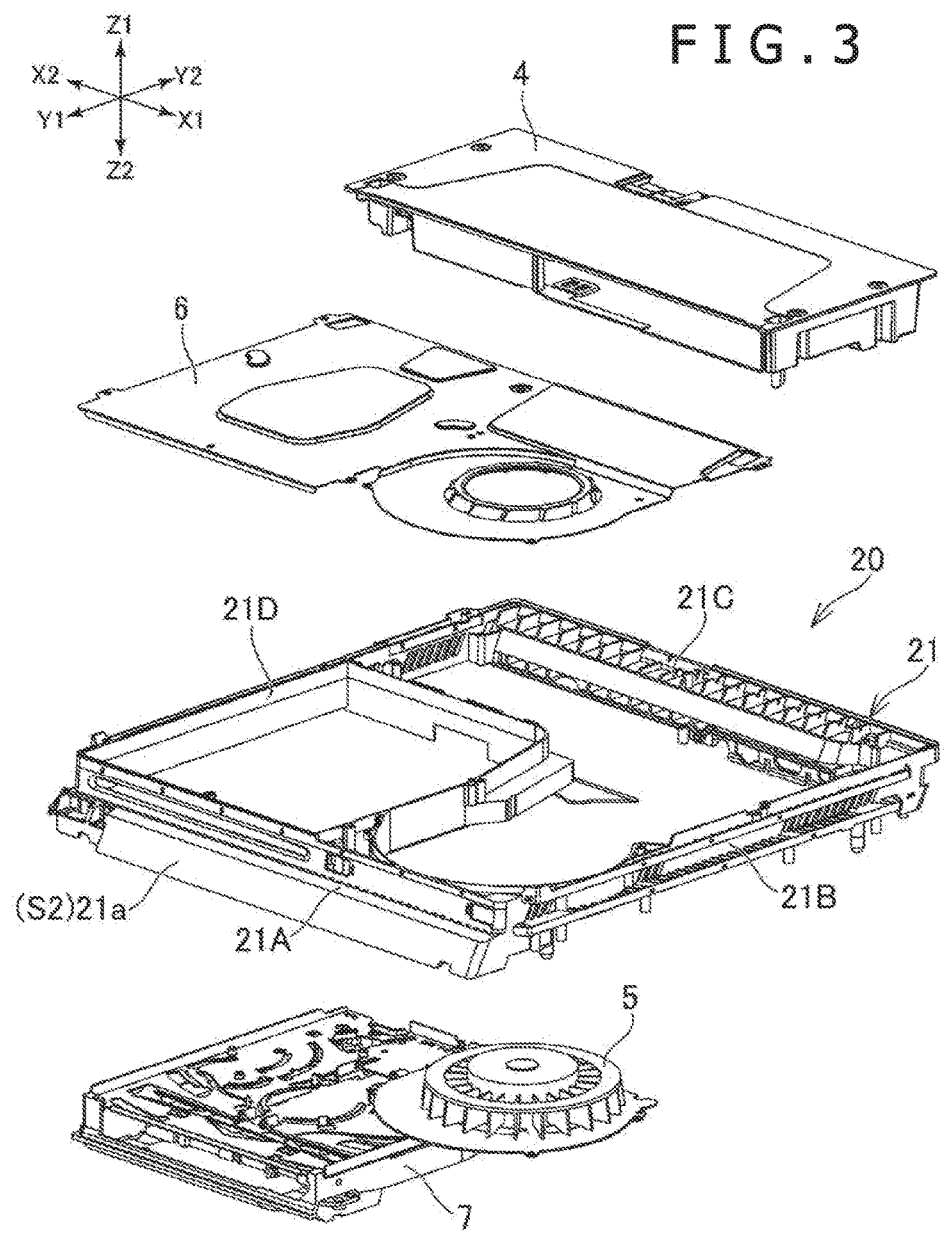
FIG. 3 is a perspective view of a frame and parts mounted to the frame, possessed by the electronic apparatus.
Figure 5:
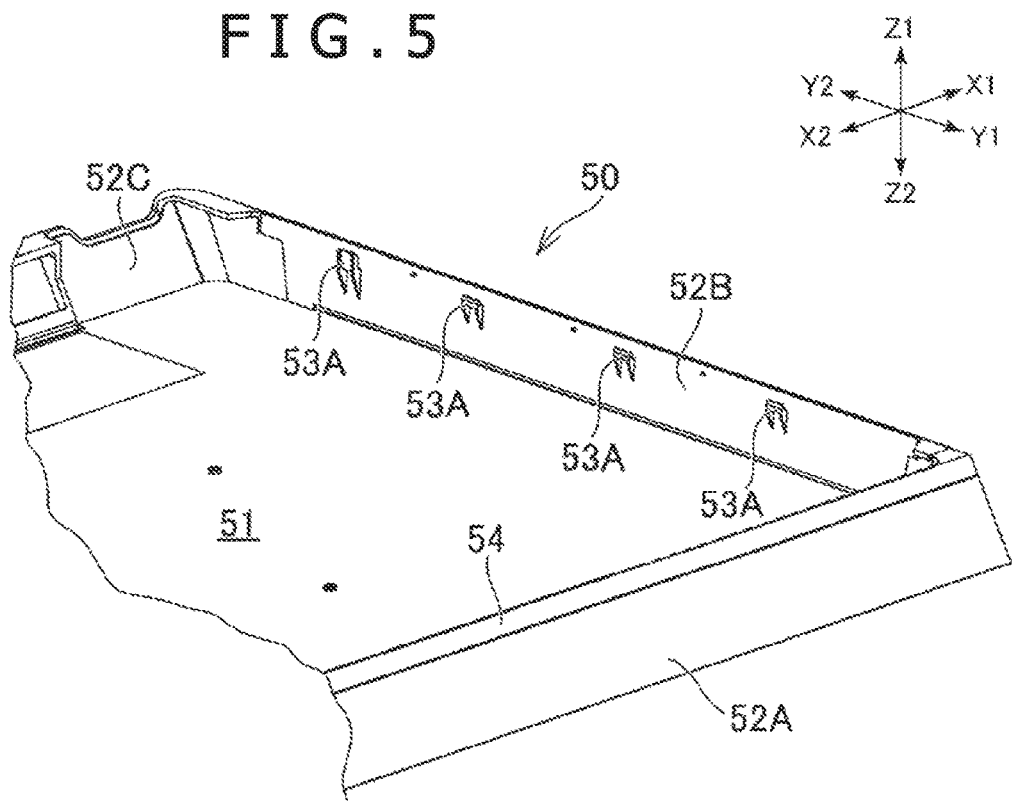
FIG. 5 is a perspective view depicting an essential portion of a lower cover possessed by the electronic apparatus.
Figure 6A:
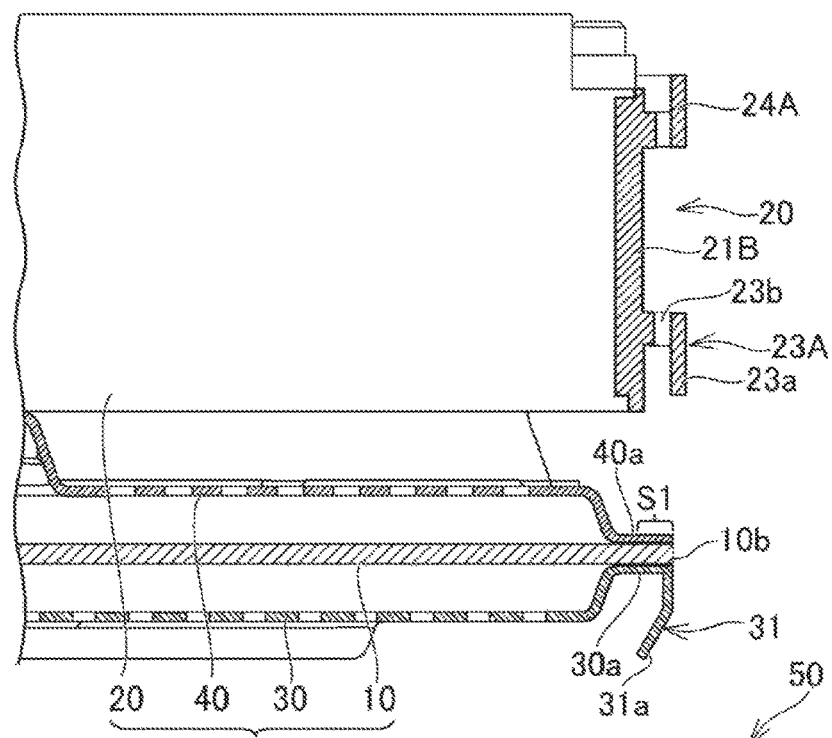
FIG. 6A is a sectional view of the electronic apparatus in a disassembled state, taken along line VI-VI of FIG. 1.
Figure 8A:
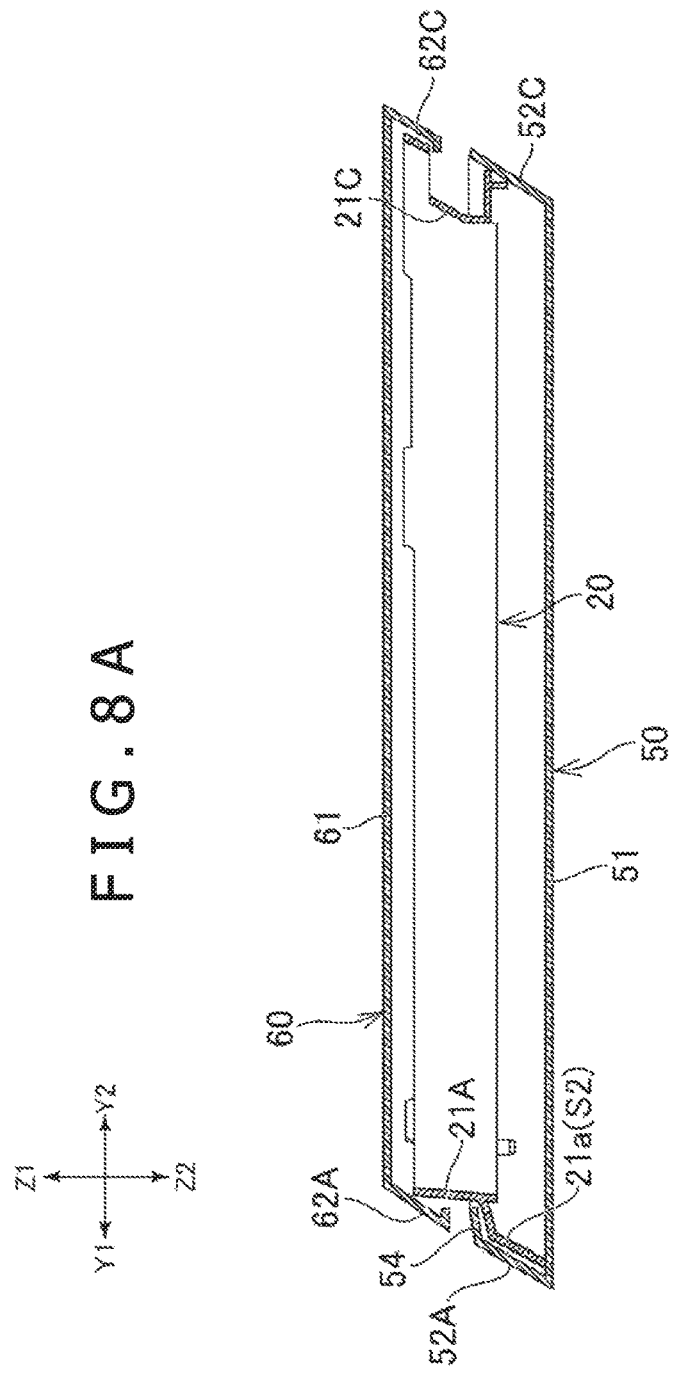
FIG. 8A is a sectional view of the electronic apparatus in a disassembled state, taken along line VIII-VIII of FIG. 1.

An embodiment of the present invention will be described below, referring to the drawings. FIG. 1 is a perspective view of an electronic apparatus 1 according to an embodiment of the present invention. FIG. 2 is an exploded perspective view of the electronic apparatus 1 depicted in FIG. 1. FIG. 3 is a perspective view of a frame 20 and parts mounted to the frame 20, possessed by the electronic apparatus 1. FIG. 4 depicts perspective views depicting essential portions of the frame 20 and a lower chassis 30. FIG. 5 is a perspective view depicting an essential portion of a lower cover 50. FIG. 6A is a sectional view of the electronic apparatus 1 in a disassembled state, taken along line VI-VI of FIG. 1. FIG. 6B is a sectional view depicting a state in which the parts depicted in FIG. 6A are combined together. FIG. 7 is a sectional view of the electronic apparatus in a disassembled state, taken along line VII-VIIB of FIG. 1. FIG. 8A is a sectional view of the frame 20 and the covers 50 and 60 constituting the electronic apparatus, taken along line VIII-VIII of FIG. 1. FIG. 8B is a sectional view depicting the posture of the frame 20 in a process of combining the frame 20 and the lower cover 50 together.

In the following description, X1 and X2 depicted in FIG. 1 will respectively be a rightward direction and a leftward direction, Y1 and Y2 will respectively be forward and rearward, and Z1 and Z2 will respectively be upward and downward.

An electronic apparatus 1 is an entertainment device that functions as a game device or an audio/visual apparatus, for example. The electronic apparatus 1 outputs moving picture data produced by execution of a game program, video/audio data acquired from a recording medium such as an optical disk, and/or video/audio data acquired through a network, to a display device such as a television. The electronic apparatus 1 is not limited to the entertainment device such as a game device, but may be a personal computer.

As depicted in FIG. 2, the electronic apparatus 1 has an inner part B and an armor member A that covers the inner part B. In the example of the electronic apparatus 1, the armor member A includes a lower cover 50 that constitutes a lower surface of the electronic apparatus 1 and covers the lower side of the inner part B, and an upper cover 60 that constitutes an upper surface of the electronic apparatus 1 and covers the upper side of the inner part B. As will be described later, the upper cover 60, the lower cover 50 and the inner part B are combined together in the vertical direction. The upper cover 60, the lower cover 50 and a frame 20, which will be described later, are formed, for example, from a resin such as a plastic.

In addition, in the example of the electronic apparatus 1, as depicted in FIG. 2, the inner part B includes the frame 20, and various parts mounted to the frame 20, specifically a circuit board 10 and chassis 30 and 40. The electronic apparatus 1 has the upper chassis 40 covering the upper side of the circuit board 10, and the lower chassis 30 covering the lower side of the circuit board 10. The chassis 30 and 40 are formed from a metal, and have a function of securing rigidity of the frame 20, as well as a function of shielding electromagnetic waves generated from the circuit board 10 and shielding electromagnetic waves generated from external devices.

As depicted in FIG. 3, a heat sink 41 for cooling an integrated circuit mounted on the circuit board may be mounted to the upper chassis 40. In addition, the upper chassis 40 may be provided with an accommodating section 42 for accommodating a hard disk device. Besides, the electronic apparatus 1 may not necessarily have the two chassis 30 and 40. In other words, the electronic apparatus 1 may have only either one of the chassis.

In the example of the electronic apparatus 1, the chassis 30 and 40 and the circuit board 10 are mounted to the lower side of the frame 20. More specifically, as depicted in FIG. 3, the frame 20 has an outer peripheral section 21 configured by a front wall section 21A and a right wall section 21B and a rear wall section 21C and a left wall section 21D. The inside of the outer peripheral section 21 is open to the upper side and the lower side. The chassis 30 and 40 and the circuit board 10 are disposed on the lower side of the outer peripheral section 21, and are mounted to the outer peripheral section 21. The chassis 30 and 40 and the circuit board 10 are mounted to the outer peripheral section 21 by fixtures such as screws, for example. In the example of the electronic apparatus 1, the lower chassis 30 has a guide section 31 (see FIG. 4) for facilitating assembly of the lower cover 50 and the inner part B and for increasing the degree of freedom in layout of parts. The guide section 31 will be described in detail later.

The parts mounted to the frame 20 are not limited to these parts. For example, as depicted in FIG. 3, a cooling fan 5 for cooling the integrated circuit mounted on the circuit board 10, an optical disk drive 7 for driving an optical disk, a power supply unit 4 supplying driving electric power for the various parts possessed by the electronic apparatus 1, and the like may be mounted to the frame 20. These parts are disposed on the inside of the outer peripheral section 21, for example. In the example of the electronic apparatus 1, a panel 6 covering the cooling fan 5 and the optical disk drive 7 is mounted to the frame 20.

As depicted in FIG. 2, the lower cover 50 includes a lower panel section 51 located under the inner part B and covering the lower side of the inner part B, and a peripheral wall section 52 formed at an outer peripheral edge of the lower panel section 51. The peripheral wall section 52 extends upward from the outer peripheral edge of the lower panel section 51, and surrounds the outer periphery of the inner part B. In the example of the electronic apparatus 1, the lower panel section 51 is substantially rectangular in shape, and the peripheral wall section 52 has four wall sections. Specifically, the peripheral wall section 52 includes: a front wall section 52A formed at a front edge of the lower panel section 51 and located on the front side of the inner part B; a right wall section 52B formed at a right edge of the lower panel section 51 and located on the right side of the inner part B; a rear wall section 52C formed at a rear edge of the lower panel section 51 and located on the rear side of the inner part B; and a left wall section 52D forming at a left edge of the lower panel section 51 and located on the left side of the inner part B. In other words, in the example of the electronic apparatus 1, the lower cover 50 is in the shape of a box opening to the upper side. The peripheral wall section 52 may not necessarily have the four wall sections. For example, the peripheral wall section 52 may be configured by only three wall sections (for example, the front wall section 52A, the right wall section 52B, and the left wall section 52D). In the electronic apparatus 1, first engaging sections 53A (see FIG. 5) are formed at the right wall section 52B, as will be described in detail later. However, the first engaging sections 53A may be formed at any one of the wall sections. In addition, in the electronic apparatus 1, a second engaging section 53B (see FIG. 7) is formed at the left wall section 52D, as will be described in detail later. However, the second engaging section 53B may be formed at the wall section on the side opposite to the wall section at which the first engaging sections 53A are formed, and the position of the second engaging section 53B may be changed according to the wall section at which the first engaging sections 53A are formed.

As depicted in FIG. 2, the upper cover 60 includes an upper panel section 61 located above the inner part B and covering the upper side of the inner part B, and a peripheral wall section 62 formed at an outer peripheral edge of the upper panel section 61. The peripheral wall section 62 extends downward from the outer peripheral edge of the upper panel section 61, and surrounds the outer periphery of the inner part B. In the example of the electronic apparatus 1, the upper panel section 61 is substantially rectangular in shape, and the peripheral wall section 62 has four wall sections. Specifically, the peripheral wall section 62 includes: a front wall section 62A formed at a front edge of the upper panel section 61 and located on the front side of the inner part B; a right wall section 62B formed at a right edge of the upper panel section 61 and located on the right side of the inner part B; a rear wall section 62C (see FIG. 8A) formed at a rear edge of the upper panel section 61 and located on the rear side of the inner part B; and a left wall section 62D (see FIG. 7) formed at a left edge of the upper panel section 61 and located on the left side of the inner part B. The peripheral wall section 62 may not necessarily have the four wall sections. For example, the peripheral wall section 62 may be configured by only three wall sections (the front wall section 62A, the right wall section 62B, and the left wall section 62D).

As depicted in FIG. 6A, the right wall section 52B of the lower cover 50 has the first engaging sections 53A. The first engaging sections 53A are formed at an inner surface of the right wall section 52B, and project toward the inner side of the peripheral wall section 52 from the right wall section 52B. On the other hand, the inner part B has a first engaged section 23A. In the example of the electronic apparatus 1, the first engaged section 23A is formed at an outer surface of the right wall section 21B of the frame 20, and projects toward the outer side (the right side) of the frame 20.

As depicted in FIG. 6B, the first engaged section 23A is located on the inner side of the peripheral wall section 52 in relation to the first engaging sections 53A in a state in which the inner part B and the lower cover 50 are combined together. In the example of the electronic apparatus 1, in the state in which the inner part B and the lower cover 50 are combined together, an upper end of the right wall section 52B of the lower cover 50 is located above a lower end of the right wall section 21B of the frame 20. Therefore, an uppermost portion of the right wall section 52B and a lowermost portion of the right wall section 21B face each other. The first engaging sections 53A are formed at the uppermost portion of the right wall section 52B of the lower cover 50, and the first engaged section 23A is formed at the lowermost portion of the right wall section 21B of the frame 20. As a result, the first engaged section 23A is located on the inner side of the peripheral wall section 52 in relation to the first engaging sections 53A. Besides, in the state in which the inner part B and the lower cover 50 are combined together, the first engaged section 23A is engaged with the first engaging sections 53A. By the engagement between the first engaged section 23A and the first engaging sections 53A, a rightward relative movement of the right wall section 52B of the lower cover 50, or a deformation such as bulging of the right wall section 52B toward the outer side of the peripheral wall section 52, is restrained.

As depicted in FIG. 6B, the inner part B has a first edge section S1 at an outer peripheral section thereof. The first edge section S1 is located below the first engaging sections 53A of the lower cover 50 in a state in which the inner part B and the lower cover 50 are combined together. The first edge section S1 is a part that overlaps with the first engaging sections 53A of the lower cover 50 when the inner part B and the lower cover 50 are viewed in the vertical direction. Specifically, a part of an outer peripheral section of the inner part B overlaps with the first engaging sections 53A of the lower cover 50, and the overlapping part is the first edge section S1. The first edge section S1 is located between an outer surface of the frame 20 and an inner surface of the peripheral wall section 52 of the lower cover 50 when the inner part B and the lower cover 50 are viewed in the vertical direction.

In the example of the electronic apparatus 1, the circuit board 10 and the chassis 30 and 40 and the lower cover 50 are laid out in such a manner that outer peripheral sections of the circuit board 10 and the upper chassis 40 and the lower chassis 30 have the first edge section S1. In other words, the circuit board 10 and the chassis 30 and 40 are mounted to the frame 20 in such a manner that a part of their outer peripheral sections constitutes the first edge section S1. In the example of the electronic apparatus 1, an end face 10b of the circuit board 10 is located on an outer side in relation to end surfaces (surfaces facing toward the inner side of the peripheral wall section 52) of the first engaging sections 53A of the lower cover 50 and an outer surface of the right wall section 21B of the frame 20.

As depicted in FIG. 6A, outer peripheral sections 30a and 40a of the chassis 30 and 40 extend to the end face 10b of the circuit board 10, and are in contact with a surface of the circuit board 10. The outer peripheral sections 30a and 40a of the chassis 30 and 40 may be electrically connected to a ground line provided at an outer peripheral section of the circuit board 10.

Note that a configuration may be adopted in which, unlike in the example of the electronic apparatus 1, the first edge section S1 is confirmed by only one or two of the three members consisting of the circuit board 10 and the chassis 30 and 40. For example, the first edge section S1 may be composed of only an outer peripheral section of the circuit board 10, and the chassis 30 and 40 may not have a part constituting the first edge section S1. On the contrary, the first edge section S1 may be composed of only the outer peripheral section 30a or 40a of the upper chassis 40 or the lower chassis 30, and the circuit board 10 may not have a part constituting the first edge section S1.

As depicted in FIG. 6A, the first engaged section 23A projects outward (in the example of the electronic apparatus 1, rightward) from an outer surface of the right wall section 21B of the frame 20. The first engaged section 23A is located on the upper side of the first edge section S1. Besides, the first engaged section 23A overlaps with the first edge section S1 when the inner part B is viewed in the vertical direction.

According to the structure in which the inner part B has the first edge section S1, the first engaging sections 53A of the lower cover 50 and the first edge section S1 would collide on each other, in a process of combining the inner part B and the lower cover 50 together in the vertical direction, which would make the combining work troublesome.

In view of this, in the example of the electronic apparatus 1, as depicted in FIG. 6A, the inner part B is provided with a guide section 31. The guide section S1 is located below the first edge section S1. In a state before the lower cover 50 and the inner part B are combined together, the first engaging sections 53A are located below the guide section 31. Therefore, in the process of combining the lower cover 50 and the inner part B together in the vertical direction, the first engaging sections 53A of the lower cover 50 come into contact with the guide section 31 earlier than the first edge section S1. Specifically, the guide section 31 comes into contact with the first engaging sections 53A located on the lower side of the guide section 31. As a result, the right wall section 52B of the cover 50 is pressed to the outer side thereof (rightward), and is elastically bent. In this instance, the first engaging sections 53A are also moved to the outer side, and are moved beyond the first edge section S1 to the upper side of the first edge section S1. As depicted in FIG. 6B, the first engaging sections 53A moved beyond the first edge section S1 are engaged with the first engaged section 23A. In this way, the guide section 31 prevents the first engaging sections 53A of the lower cover 50 and the first edge section S1 from colliding on each other in the process of combining the lower cover 50 and the inner part B together in the vertical direction. As a result, the work of combining the lower cover 50 and the inner part B together can be facilitated. In addition, since the outer peripheral sections of the circuit board 10 and the chassis 30 and 40 can be disposed under the first engaging sections 53A, the degree of freedom in layout of them can be increased. In other words, the circuit board 10 and the chassis 30 and 40 can be disposed in extreme proximity to the right wall section 52B of the lower cover 50.

In the example of the electronic apparatus 1, the guide section 31 overlaps with the first engaging sections 53A of the lower cover 50 when the lower cover 50 and the inner part B are viewed in the vertical direction. Besides, the guide section 31 is formed such as to press the first engaging sections 53A, of the right wall section 52B of the lower cover 50.

As depicted in FIG. 6A, the guide section 31 has a slant surface 31a. The slant surface 31a is formed in such a manner that the right wall section 52b (more specifically, the first engaging sections 53A) having come into contact with the surface of the slant surface 31a is guided toward the outer side of the peripheral wall section 52. Specifically, the slant surface 31a is inclined such as to extend toward the inner side and the lower side of the outer peripheral section 21 of the frame 20. In other words, the slant surface 31a approaches the end surface of the inner part B (the end face 10b of the circuit board 10) gradually in going from its lower edge toward its upper edge. The first engaging sections 53a first make contact with a position near the lower edge of the slant surface 31a, and then move toward the upper edge of the slant surface 31a. According to such a guide section 31, in the process of combining the lower cover 50 and the inner part B together in the vertical direction, the first engaging sections 53A of the lower cover 50 come into contact with the guide section 31, and are pressed toward the outer side (the right side) of the peripheral wall section 53. Then, the first engaging sections 53A move beyond the first edge section S1 to the upper side of the first edge section 51.

As aforementioned, the lower chassis 30 is formed of a metallic sheet. In the example of the electronic apparatus 1, the guide section 31 is formed in the lower chassis 30. Specifically, as depicted in FIG. 6A, an end portion of the lower chassis 30 is bent toward the side opposite to the first edge section S1, and the bent part constitutes the guide section 31. With a part of the lower chassis 30 thus utilized as the guide section 31, the guide section 31 can be formed comparatively easily, and an increase in the number of parts can be restrained.

The guide section 31 is not limited to that in the example of the electronic apparatus 1. For example, the guide section may be formed in the upper chassis 40. In this case, a right end portion of the upper chassis 40 may be bent toward the lower side, and may be disposed such as to be located on the lower side of a right end portion of the circuit board 10 (in other words, the first edge section S1). In addition, the guide section may be formed in other part possessed by the inner part B. For example, the guide section may be configured by a part mounted on the circuit board 10.

In the example of the electronic apparatus 1, the right wall section 52B of the lower cover 50 has the plurality of first engaging sections 53A which are aligned in the front-rear direction (see FIG. 5). The guide section 31 also extends in the front-rear direction, and has a length corresponding to the positions of the plurality of first engaging sections 53A (see FIG. 4). According to such a guide section 31, it is easier to secure the strength of the guide section 31, as compared to the case where a plurality of guide sections 31 corresponding to the positions of the plurality of engaging sections 53 of the right wall section 52 are formed in the lower chassis 30.

The guide section 31 may be partly cut between its front end and its rear end, as depicted in an example of FIG. 4. In place of the example of FIG. 4, the guide section 31 may be continuous from its front end to the rear end. In addition, a plurality of guide sections 31 corresponding to the positions of the plurality of first engaging sections 53 may be provided in the inner part B. The length of the guide section 31 is not particularly limited, so long as the guide section 31 is present on the lower side of one of the first engaging sections 53A.

The first engaging sections 53A of the lower cover 50 are engaged with the first engaged section 23A in such a manner that the right wall section 52B is not separated from the first engaged section 23A toward the outer side (the right side) of the peripheral wall section 52. In the example of the electronic apparatus 1, the first engaged section 23A is provided in the inner part B (more specifically, the frame 20), as aforementioned. The first engaging sections 53A of the lower cover 50 are engaged with the first engaged section 23A such that the right wall section 52B will not be separated from the frame 20 to the outer side (the right side).

In the example of the electronic apparatus 1, as depicted in FIG. 6A, the first engaging sections 53A of the lower cover 50 have projections 53a projecting upward. The first engaged section 23A projects rightward from the right wall section 52B of the frame 20. Besides, the first engaged section 23A has a projection 23a projecting downward. As depicted in FIG. 6B, the projections 53a of the first engaging sections 53A are engaged with the projection 23a of the first engaged section 23A. Specifically, the projections 53a of the first engaging sections 53A are fitted between the projection 23a of the first engaged section 23A and an outer surface of the right wall section 21B of the frame 20, and the projection 23a of the first engaged section 23A is fitted between the projections 53a of the first engaging sections 53A and an inner surface of the right wall section 52B of the lower cover 50.

In the example of the electronic apparatus 1, as depicted in FIG. 4, the first engaged section 23A extends in the front-rear direction along the right wall section 21B of the frame 20. The length of the first engaged section 23A corresponds to the length of the right wall section 21B of the frame 20. The projection 23a extends in the front-rear direction, and a groove is formed between the projection 23a and an outer surface of the right wall section 21B. The shape of the first engaged section 23A is not restricted to that in the example of the electronic apparatus 1. For example, the electronic apparatus 1 may have a plurality of first engaged sections 23A corresponding to the plurality of first engaging sections 53A.

As depicted in FIG. 4, in the example of the electronic apparatus 1, the first engaged section 23A is formed with holes 23b which penetrate the first engaged section 23A in the vertical direction. The holes 23b may function as ventilation holes for taking in external air into the electronic apparatus 1 therethrough. The first engaged section 23A may not be formed with the holes 23b for ventilation.

As aforementioned, the peripheral wall section 52 of the lower cover 50 has the left wall section 52D. As depicted in FIG. 7, the left wall section 52D has second engaging sections 53B projecting toward the inner side of the peripheral wall section 52, like the right wall section 52B. The inner part B has a second engaged section 23B. The second engaged section 23B is located on the inner side of the peripheral wall section 52 of the lower cover 50, and is engaged with the second engaging sections 53B. The second engaged section 23B is engaged with the second engaging sections 53B, to thereby restrict the left wall section 52D of the lower cover 50 from moving toward the outer side (the left side) of the peripheral wall section 52. In the example of the electronic apparatus 1, the second engaged section 23B is formed in the left wall section 21D of the frame 20. Therefore, the second engaged section 23B restricts the left wall section 52D of the lower cover 50 from being separated leftward from the left wall section 21D of the frame 20.

The second engaging sections 53B have the similar structure as the aforementioned first engaging sections 53A, and the second engaged section 23B has the similar structure as the aforementioned first engaged section 23A. Specifically, in the example of the electronic apparatus 1, the second engaging sections 53B of the lower cover 50 have projections 53a projecting upward. The second engaged section 23B projects leftward from the left wall section 52D of the frame 20. The second engaged section 23B has a projection 23a projecting downward. The projections 53a of the second engaging sections 53B are engaged with the projection 23a of the second engaged section 23B. Specifically, the projections 53a of the second engaging sections 53B are fitted between the projection 23a of the second engaged section 23B and an outer surface of the left wall section 21D of the frame 20, and the projection 23a of the second engaged section 23B is fitted between the projections 53a of the second engaging sections 53B and an inner surface of the left wall section 52D of the lower cover 50.

In one example, the first edge section S1 depicted in FIG. 6A and the like is not provided on the left side of the electronic apparatus 1. Therefore, in the process of combining the inner part B and the lower cover 50 together in the vertical direction, the second engaging sections 53B of the lower cover 50 are fitted to the second engaged section 23B without undergoing a process in which the left wall section 52D is pushed leftward.

Note that the first edge section S1 may be provided also on the electronic apparatus, unlike in the example of the electronic apparatus 1. In this case, it is desirable for the lower chassis 30 to have the guide section 31 also at a left edge portion thereof.

As depicted in FIGS. 5 and 8A, the front wall section 52A of the lower cover 50 has a projecting portion 54 projecting toward the inner side of the peripheral wall section 52, in other words, projecting toward the rear side. In the example of the electronic apparatus 1, the projecting portion 54 is formed at an upper edge of the front wall section 52A. The projecting portion 54 extends in the left-right direction along the upper edge of the front wall section 52A. In the example of the electronic apparatus 1, the projecting portion 54 extends from the left wall section 52D to the right wall section 52B of the lower cover 50.

As depicted in FIGS. 3 and 8A, the inner part B has a second edge section S2 on the front side thereof. The second edge section S2 is located below the projecting portion 54 of the lower cover 50 in a state in which the inner part B and the lower cover 50 are combined together. The second edge section S2 is a part which is located beneath the projecting portion 54 of the lower cover 50 in the state in which the inner part B and the lower cover 50 are combined together and which overlaps with the projecting portion 54 of the lower cover 50 when the inner part B and the lower cover 50 are viewed in the vertical direction. Specifically, a part of an outer peripheral section of the inner part B overlaps with the projecting portion 54 of the lower cover 50, and the overlapping part constitutes the second edge section S2. By such a second edge section S2, the inner part B and the lower cover 50 can be restrained from being separated from each other in the vertical direction. Specifically, the second edge section S2 is caught on the projecting portion 54 of the lower cover 50 in such a manner that the inner part B is not separated upward from the lower cover 50.

In the example of the electronic apparatus 1, the second edge section S2 is provided in the frame 20. Specifically, as depicted in FIG. 8A, a lower portion 21a of the front wall section 21A of the frame 20 protrudes forward. The lower portion 21a constitutes the second edge section S2. In the example of the electronic apparatus 1, the lower portion 21 (the second edge section S2) of the front wall section 21A is formed to be along inner surfaces of the projecting portion 54 and the front wall section 52A of the lower cover 50. According to such a front wall section 21A, the parts possessed by the electronic apparatus 1 can be disposed in a space surrounded by the projecting portion 54 and the lower panel section 51 and the front wall section 52A, so that effective utilization of space can be achieved.

In this way, in the example of the electronic apparatus 1, the edge sections S1 and S2 are provided on the right side and the front side of the inner part B. Specifically, when the direction where the first edge section S1 is located relative to the inner part B is defined as the direction D1, the second edge section S2 is located in a direction intersecting the direction D1. More specifically, the second edge section S2 is located in the direction orthogonal to the direction D1. In other words, the first edge section S1 and the second edge section S2 are located at mutually intersecting two sides, of four sides of a rectangle.

The electronic apparatus 1 having such edge sections S1 and S2 can be assembled, for example, in the following manner. As depicted in FIG. 8B, first, the inner part B (in FIG. 8B, only the frame 20 is depicted) is inclined relative to the lower cover 50, and the second edge section S2 of the inner part B is fitted in between the projecting portion 54 and the lower panel section 51 of the lower cover 50. Thereafter, as indicated by arrow H in FIG. 8B, the rear side of the inner part B is lowered toward the lower cover 50. In this instance, the first engaging sections 53A of the lower cover 50 come into contact with the guide section 31 of the inner part B (more specifically, the lower chassis 30). Consequently, the right wall section 52B of the lower cover 50 is bulged rightward. Then, the first engaging sections 53A pass the outer side (the right side) of the first edge section S1 of the inner part B to move to the upper side of the first edge section S1 while being guided by the guide section 31, and are engaged with the first engaged section 23A. On the other hand, the second engaging sections 53B of the lower cover 50 are engaged with the second engaged section 23B of the inner part B, without coming into contact with the inner part B. By such a procedure, the inner part B and the lower cover 50 are combined together. Note that the lower cover 50 may be mounted to the inner part B by fixtures such as screws. For example, the rear wall section 52C of the lower cover 50 may be mounted to the rear wall section 21C of the frame 20 by a fixture.

As aforementioned, the electronic apparatus 1 has the upper cover 60. As depicted in FIG. 6A, the right wall section 62B of the upper cover 60 may also have an engaging section or sections 63A. In addition, the right wall section 21B of the frame 20 may have an engaged section 24A (see FIG. 4) for engagement with the engaging section or sections 63A. Similarly, the left wall section 62D of the upper cover 60 may also have an engaging section or sections 63B (see FIG. 7). Besides, the left wall section 21D of the frame 20 may have an engaged section 24B for engagement with the engaging section or sections 63B.

Figure 10:
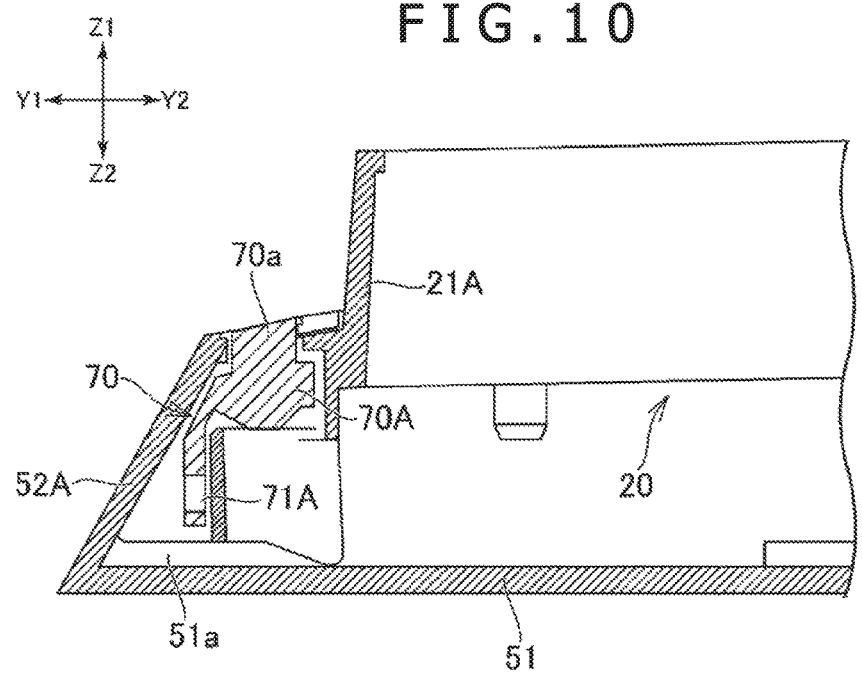
FIG. 10 is a sectional view taken along line X-X of FIG. 9.
Figure 11:
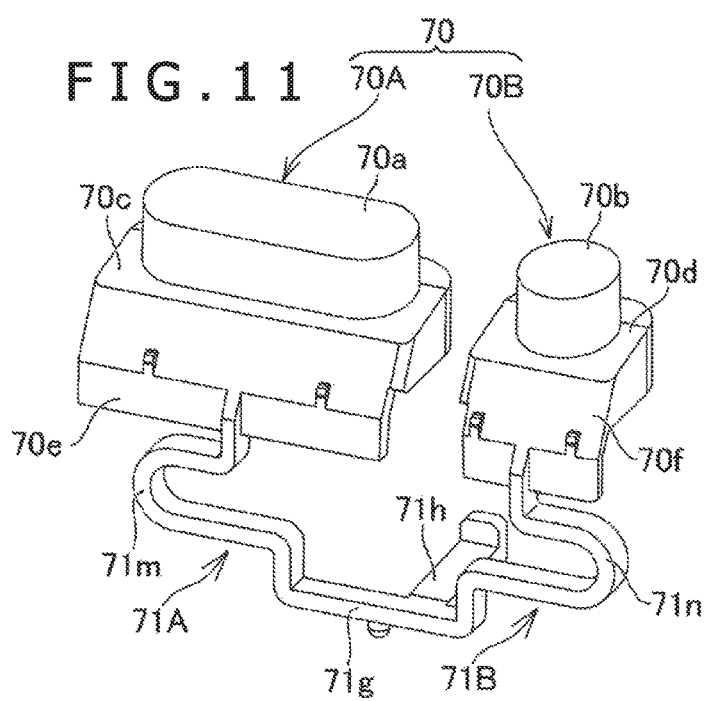
FIG. 11 is a perspective view of the button member.
Figure 12:
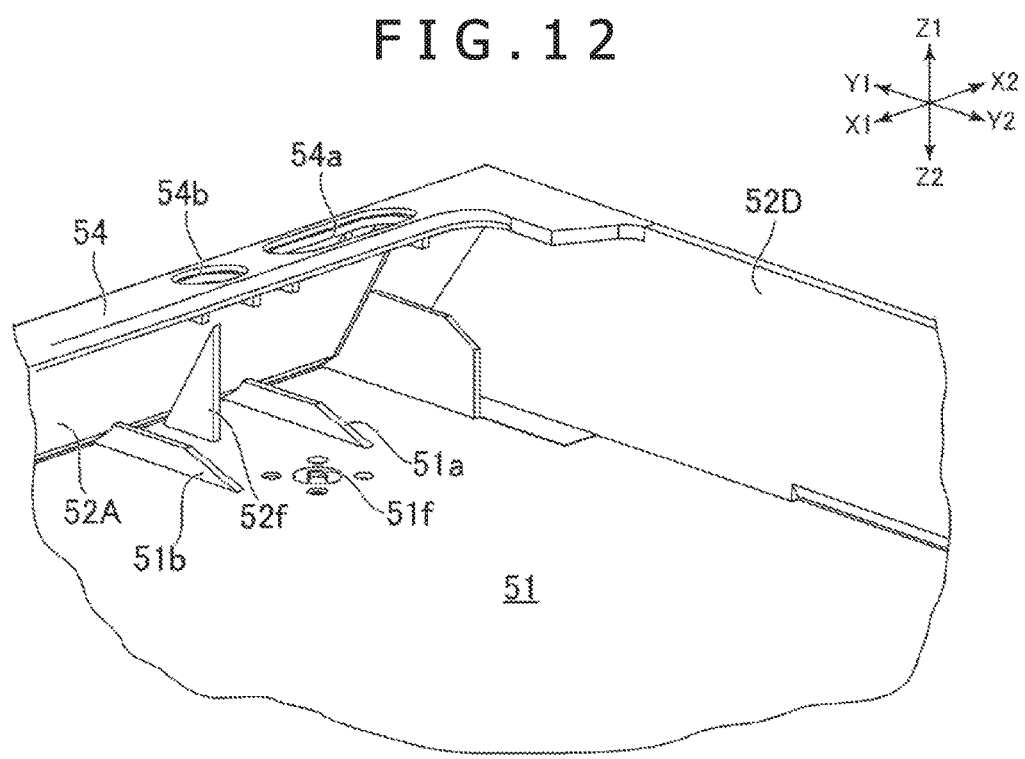
FIG. 12 is a perspective view of the lower cover at which the button member is disposed, as viewed from inside.

FIGS. 9 to 12 are figures for explaining the structure of a button member 70 possessed by the electronic apparatus 1. FIG. 9 is a perspective view of a portion where a button member 70 is disposed. FIG. 10 is a sectional view taken along line X-X of FIG. 9. FIG. 11 is a perspective view of the button member 70. FIG. 12 is a perspective view of the lower cover 50 at which the button member 70 is disposed, as viewed from inside.

As depicted in FIG. 9, in the example of the electronic apparatus 1, the button member 70 is disposed at the lower cover 50. As aforementioned, the lower cover 50 includes the lower panel section 51, the front wall section 52A formed at the front edge of the lower panel section 51, and the projecting portion 54 formed at the upper edge of the front wall section 52A and projecting to the rear side. The button member 70 is disposed on the lower side of the projecting portion 54. Specifically, the button member 70 is disposed in a space surrounded by the lower panel section 51 and the front wall section 52 and the projecting portion 54.

The projecting portion 54 is formed with holes 54a and 54b (see FIG. 12), and top portions 70a and 70b (see FIG. 11) of the button member 70 are exposed through the holes 54a and 54b. In the example of the electronic apparatus 1, the button member 70 includes a first button section 70A and a second button section 70B. The first button section 70A and the second button section 70B are formed integrally. The top portion 70a of the first button section 70A and the top portion 70b of the second button section 70B are exposed through the holes 54a and 54b, respectively. The first button section 70A and the second button section 70B are, for example, a power supply button for turning ON or OFF a power supply for the electronic apparatus 1 and an ejection button for ejecting an optical disk from the optical disk drive 7. A switch board (not depicted) on which switches are mounted is disposed on the lower side of the top portions 70a and 70b of the button sections 70A and 70B. When the button section 70A or 70B is depressed, the button section 70A or 70B turns a switch ON or OFF.

As depicted in FIG. 11, the button member 70 has spring sections 71A and 71B. The spring sections 71A and 71B are disposed on the lower panel section 51, and bias the button sections 70A and 70B upward, or toward the projecting portion 54. The first button section 70A has a flange section 70c at a lower edge of the top portion 70a. The second button section 70B has a flange section 70d at a lower edge of the top portion 70b. The button sections 70A and 70B are being biased upward by the spring sections 71A and 71B, and the flange sections 70a and 70b are being pressed against the edges of the holes 54a and 54b, respectively.

According to the structure of the button member 70 as just-described, the spring sections 71A and 71B can be temporarily shrunk in a process of mounting the button member 70 to the lower cover 50, and, therefore, the work of mounting the button member 70 to the lower cover 50 can be facilitated. In addition, since the button sections 70A and 70B are being biased upward by the spring sections 71A and 71B and being pressed against the edges of the holes 54a and 54b, the button sections 70A and 70B can be disposed at positions suitable for the holes 54a and 54b. When the top portion 70a or 70b of the button section 70A or 70B is depressed by a user, the spring section 71A or 71B returns the button section 70A or 70B into an initial position. Therefore, the spring sections 70A and 70B of the button member 70 have two functions, namely, a function of facilitating the work of mounting the button member 70 and a function of returning the button sections 70A and 70B into initial positions.

As depicted in FIG. 11, the two spring sections 71A and 71B have a connection section 71g at lower ends thereof. The connection section 71g has an extension section 71h extending rearward. A rear end of the extension section 71h is supported by, for example, a support portion formed in the lower panel section 51. In the example described here, the lower panel section 51 is formed with a recess 51f (see FIG. 12) in which to fit the rear end of the extension section 71h. According to such a structure, the posture of the button member 70 can be stabilized. The extension section 71h and the recess 51f may not necessarily be provided.

As depicted in FIG. 11, the flange sections 70c and 70d of the button sections 70A and 70B have drooping sections 70e and 70f extending downward, on the front side thereof. One end (upper end) of the spring section 71A and one end (upper end) of the spring section 71B are connected to the drooping sections 70e and 70f, respectively. The other end (lower end) of the spring section 71A and the other end (lower end) of the spring section 71B are connected to each other. The spring sections 71A and 71B have curved sections 70m and 70n which are curved such as to bulge to opposite sides. When the button section 70A or 70B is depressed, the spring section 71A or 71B exhibits an elastic force by flexure of the curved section 70m or 70n. As depicted in FIG. 12, the lower panel section 51 is formed with ribs 51a and 51b projecting upward. The spring sections 71A and 71B are located respectively over the ribs 51a and 51b, and are supported by the ribs 51a and 51b when the button sections 70A and 70B are depressed.

As depicted in FIG. 12, the front wall section 52A of the lower cover 50 has a rib 52f formed along an inner surface thereof. The rib 52f is located between the two button sections 70A and 70B. The posture of the two button sections 70A and 70B can be stabilized by the rib 52f.

As has been described above, the lower cover 50 has the first engaging sections 53A, and the inner part B has the first edge section S1. In addition, the inner part B has the guide section 31 located below the first edge section S1. The guide section 31 is formed in such a manner that in the process of combining the lower cover 50 and the inner part B together in the vertical direction, it comes into contact with the right wall section 52B of the lower cover 50 to push the right wall section 52B rightward, and the first engaging sections 53A move beyond the first edge section S1 to the upper side of the first edge section S1. By this guide section 31, the work of combining the lower cover 50 and the inner part B together can be facilitated.

Note that the present invention is not limited to the electronic apparatus 1 as described above, and various modifications are possible.

For example, the electronic apparatus 1 has had the frame 20, and the circuit board 10 and the chassis 30 and 40 have been mounted to the frame 20. However, the electronic apparatus 1 may not necessarily have the frame 20. For instance, the electronic apparatus 1 may have an upper housing and a lower housing which are combined with each other in the vertical direction to form a box. In this case, the circuit board 10 and the chassis 30 and 40 may be fixed to the lower housing. In addition, the circuit board 10 and the chassis 30 and 40 may have the first edge section S1, the upper housing may be formed with the first engaging sections, and the lower housing may be formed with the first engaged section. Besides, the upper chassis 40 may be formed with a guide section for pressing the first engaging sections of the upper housing to the outer side.

In addition, in the electronic apparatus 1, the outer peripheral sections of the circuit board 10 and the chassis 30 and 40 have constituted the first edge section S1. However, the first edge section S1 may be configured by other part. Specifically, a part of the other part may be disposed such as to overlap with the first engaging sections 53A of the lower cover 50 in the vertical direction.

The invention claimed is:

1. An electronic apparatus comprising:
an inner part; and
an armor member disposed on one side in a first direction in relation to the inner part and covering the inner part,
wherein the inner part includes a first edge section and a guide section located on the one side in the first direction in relation to the first edge section,
the armor member includes a peripheral wall section which includes in part thereof a first wall section located in a second direction intersecting the first direction in relation to the inner part and which surrounds an outer periphery of the inner part, and a first engaging section which is formed in the first wall section and which projects toward an inner side of the peripheral wall section,
the first engaging section of the armor member is located on the other side in the first direction in relation to the first edge section of the inner part, in a state wherein the inner part and the armor member are combined together in the first direction, and is disposed at such a position as to overlap with the first edge section of the inner part when the armor member and the inner part are viewed in the first direction, and is engaged with a first engaged section located on the inner side of the peripheral wall section, and
the guide section of the inner part is formed in such a manner that in a process wherein the inner part and the armor member are combined together in the first direction, the guide section comes into contact with the first wall section located on the one side in the first direction in relation to the guide section to push the first wall section in the second direction, so as to cause the first engaging section to go over the first edge section of the inner part to reach the other side in the first direction.

2. The electronic apparatus according to claim 1,
wherein the guide section is formed in such a manner that in the process wherein the inner part and the armor member are combined together in the first direction, the guide section comes into contact with the first engaging section located on the one side in the first direction in relation to the guide section and pushes the first engaging section in the second direction.

3. The electronic apparatus according to claim 1,
wherein the first engaging section of the armor member is engaged with the first engaged section in such a manner as to prevent the first wall section from being separated from the first engaged section in the second direction.

4. The electronic apparatus according to claim 1,
wherein the inner part includes a first part including the first edge section, and a second part located on the one side in the first direction in relation to the first part and having the guide section.

5. The electronic apparatus according to claim 4,
wherein the first part includes a circuit board.

6. The electronic apparatus according to claim 5,
wherein the second part is a chassis covering the circuit board.

7. The electronic apparatus according to claim 1,
wherein the guide section is formed from a metal.

8. The electronic apparatus according to claim 1,
wherein the peripheral wall section of the armor member includes a second wall section which is located in a third direction, intersecting both the first direction and the second direction, in relation to the inner part;
the second wall section of the armor member has a projecting portion projecting toward an inner side of the peripheral wall section; and
the inner part has a second edge section which overlaps with the projecting portion of the armor member when the armor member and the inner part are viewed in the first direction and which is located on the one side in the first direction in relation to the projecting portion of the armor member.

9. The electronic apparatus according to claim 1,
wherein the peripheral wall section of the armor member includes a third wall section located on a side opposite to the first wall section; and
the third wall section has a second engaging section which projects toward an inner side of the peripheral wall section and which is engaged with a second engaged section located on the inner side of the peripheral wall section in a state wherein the armor member and the inner part are combined together.

10. The electronic apparatus according to claim 1,
wherein the armor member has a plurality of first engaging sections aligned along the first wall section, as the first engaging section.

* * * * *